United States Patent
Naundorf et al.

(10) Patent No.: US 8,227,297 B2
(45) Date of Patent: Jul. 24, 2012

(54) METHOD FOR PRODUCING A HERMETICALLY SEALED, ELECTRICAL FEEDTHROUGH USING EXOTHERMIC NANOFILM

(75) Inventors: Jörg Naundorf, München (DE); Hans Wulkesch, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/736,669

(22) PCT Filed: Apr. 28, 2009

(86) PCT No.: PCT/EP2009/055131
§ 371 (c)(1),
(2), (4) Date: Oct. 28, 2010

(87) PCT Pub. No.: WO2009/133105
PCT Pub. Date: Nov. 5, 2009

(65) Prior Publication Data
US 2011/0049729 A1    Mar. 3, 2011

(30) Foreign Application Priority Data
Apr. 28, 2008  (DE) .................. 10 2008 021 167

(51) Int. Cl.
*H01L 21/44*  (2006.01)

(52) U.S. Cl. ............... 438/119; 257/779; 257/E21.514; 257/E23.023

(58) Field of Classification Search ................ 438/119; 257/779, E21.514, E23.023
See application file for complete search history.

(56) References Cited

U.S. PATENT DOCUMENTS

| | | | |
|---|---|---|---|
| 7,285,321 B2 * | 10/2007 | Kanakarajan et al. | ........ 428/209 |
| 2003/0010759 A1 | 1/2003 | Accou | |
| 2004/0040578 A1 * | 3/2004 | Simon | ................. 134/6 |
| 2004/0251524 A1 | 12/2004 | Snyder et al. | |
| 2006/0108397 A1 * | 5/2006 | Tonkovich et al. | ........... 228/101 |
| 2006/0219759 A1 | 10/2006 | Duckham et al. | |
| 2007/0132094 A1 | 6/2007 | Shimura et al. | |
| 2007/0235500 A1 * | 10/2007 | Suh et al. | ...................... 228/101 |

FOREIGN PATENT DOCUMENTS

| | | |
|---|---|---|
| DE | 10 2008 021 167.2 | 4/2008 |
| EP | 1 278 240 | 1/2003 |

(Continued)

OTHER PUBLICATIONS

J.S. Subramanian et al., "Direct Die Attach With Indium Using a Room Temperature Soldering Process," Reactive Nano Technologies, 111 Lake Front Drive, Hunt Valley, MD 21030, 7 pages.

D. Van Heerden et al., "A Tenfold Reduction in Interface Thermal Resistance for Heat Sink Mounting," Reactive Nano Technologies, 111 Lake Front Drive, Hunt Valley, MD 21030, 6 pages.

(Continued)

*Primary Examiner* — Alexander Ghyka
*Assistant Examiner* — Stanetta Isaac
(74) *Attorney, Agent, or Firm* — Staas & Halsey LLP

(57) ABSTRACT

A method generates at least one electrical connection from at least one electronic component, which is positioned on a substrate inside an encapsulation, to outside the encapsulation. The functional capability of the electrical connection is to be provided at ambient temperatures greater than 140° C. and in the event of large power losses and extreme environmental influences. A reactive nanofilm, having targeted reaction, which can be triggered exothermically by laser, is used to produce hermetically sealed electrical connections. Using the nanofilm, an output of an electrical connection and a contact of the electrical connection to at least one further electrical contact can be provided.

19 Claims, 2 Drawing Sheets

FOREIGN PATENT DOCUMENTS

| | | |
|---|---|---|
| GB | 2300375 | 11/1996 |
| WO | 2005/011908 | 2/2005 |
| WO | 2007/127931 | 11/2007 |
| WO | PTC/EP2009/055131 | 4/2009 |

OTHER PUBLICATIONS

International Search Report for PCT/EP2009/055131, mailed on Aug. 28, 2009.

* cited by examiner

METHOD FOR PRODUCING A HERMETICALLY SEALED, ELECTRICAL FEEDTHROUGH USING EXOTHERMIC NANOFILM

CROSS REFERENCE TO RELATED APPLICATIONS

This application is based on and hereby claims priority to International Application No. PCT/EP2009/055131 filed on Apr. 28, 2009 and German Application No. 10 2008 021 167.2 filed on Apr. 28, 2008, the contents of which are hereby incorporated by reference.

BACKGROUND

As the trend toward mechatronic integration continues there is increasing use of electronics and sensors at significantly higher ambient temperatures/thermal power losses under simultaneously very harsh application or environmental conditions. In the field of high-temperature electronics in particular, this requires hermetically sealed, robust and integratable connections to the outside world to be provided in a minimum of installation space. At temperatures above 150° C., electrical feedthroughs in plastic packages are often suitable only to a limited extent. Studies show that at 180° C. first failures of the circuits integrated in the plastic package will occur already within 250 hours. Known electrical metal-glass feedthroughs are frequently problematic in terms of manufacturability, in particular in terms of planar manufacturing methods and thermal adaptation, and with regard to integration into the package.

Glass feedthroughs have been used in electrical feedthroughs in metal packages, as provided for example with kovar (kovar denotes alloys having a low coefficient of thermal expansion, typically approx. 5 ppm/K, which is therefore lower than the coefficient for metals; composition e.g. 54% iron, 29% nickel and 17% cobalt; other compositions are also possible). The package is then sealed by a cover which generally is welded using a roll seam. In ceramic packages, use is made of ceramics sintered in multilayer technology and having metallized current feedthroughs. In such an arrangement a cavity is provided for mounting of the chip and for the wiring by bonding. Typically, the cover has to be soldered, in particular using inert protective gas, without the use of flux, with gold surfaces being used. Molded metallic frames/leadframes are often used in electrical feedthroughs in plastic packages. In terms of the necessary hermiticity and due to the mechanical stresses occurring, encasements made of plastic can only be used to a limited degree for higher temperatures.

"A Tenfold Reduction in Interface Thermal Resistance for Heat Sink Mounting" D. Van Heerden, O. M. Knio, and T. P. Weihs; Reactive Nano Technologies, 111 Lake Front Drive, Hunt Valley, Md. 21030 ("Van Heerden et al."), discloses a tenfold reduction in the thermal resistance of an interface for heat sink mounting. The company "Reactive Nano Technologies (RNT)" has developed a new platform joining technology that can form a metallic bond between a chip package and a heat sink and at the same time offer a thermal interface resistance that is ten times lower than that of current thermal interface materials (TIMs). The joining process is based on the use of reactive multilayer foils as local heat sources. The foils are a new class of nano-engineered materials in which self-propagating exothermic reactions can be initiated at room temperature by a hot filament or laser. When a multilayer foil is inserted between two solder layers and a chip package and heat sink, heat generated by a chemical reaction in the foil heats the solder to melting point and consequently bonds the components. The joining process can be completed in air, argon or vacuum in approximately one second. The resulting metallic joints exhibit thermal conductivities that are two orders of magnitude higher and thermal resistivities that are an order of magnitude lower than current commercial thermal interface materials (TIMs). It is demonstrated using numeric models that the thermal exposure of microelectronic packages during joining is very limited. Finally it is shown numerically that reactive joining can be used to solder silicon dies directly to heat sinks without thermally damaging the chip.

"Direct Die Attach With Indium Using a Room Temperature Soldering Process" J. S. Subramanian, T. Rüde, J. Newson, Z. He, E. Besnoin, T. Weihs; Reactive Nano Technologies, 111 Lake Front Drive, Hunt Valley, Md. 21030, discloses a direct die attach technique with indium using a room temperature soldering process. A new joining process is described which allows fluxless, lead-free soldering at room temperature through the use of reactive multilayer foils as a local heat source. Activating a multilayer foil between solder layers on components causes heat to be generated due to a reaction within the foil. This process provides sufficient localized heat to melt the solder and bond the components together. The use of this foil to enable silicon dies to be attached directly to thermal management components is presented. Results of the modeling system for predicting temperatures at various interfaces during the joining are shown and verified. In the final section, data on thermal performance is provided which indicates that a six- to eightfold improvement on die sizes from 8×8 mm to 17.5×17.5 mm is made possible.

SUMMARY

It is one potential object to provide a method for consistently and reliably producing at least one hermetically sealed electrical connection from at least one electronic component positioned inside an encapsulation on a substrate to outside of the encapsulation. The aim is to consistently and reliably maintain the functional performance of a component at high ambient temperatures, in particular in the range above 140° C., as well as in the case of large thermal power losses, in particular in the range up to 600 watts, and under extreme environmental conditions, such as high atmospheric humidity for example; in this case the size of an electronic component typically lies in the range from 0.05 mm$^2$ to 150 mm$^2$, for example.

In order to ensure a hermetically sealed, electrical feedthrough/contacting, the inventors propose an arrangement comprising reactive nanofoil and solder layers produced on both sides thereof.

Nanofoil is a foil having a reactive filler medium which reacts exothermically upon initiation. According to the present invention an exothermic reaction can be initiated by the nanofoil. A particularly suitable candidate fur use as a nanofoil is a foil marketed under the trade name NanoFoil® by the company Reactive Nano Technologies RNT. During the exothermic reaction high temperatures are produced, for example in an aluminum-nickel multilayer, in the range from 1000° C. to 2000° C.

The electrical connections or feedthroughs are hermetically tight and easy to integrate because they are planar and highly heat-conductive. Easy-to-integrate, planar electrical interlayer connections are provided in a simple manner. The electrical feedthroughs exhibit good thermal conductance and thermal spread.

Owing to the locally limited heating during soldering with reactive nanofoil there is a reduction in thermally induced mechanical stresses while at the same time the components are exposed to a substantially lower temperature load.

According to an advantageous embodiment an exothermic reaction of the nanofoil is activated outside of the encapsulation for the purpose of contacting the electrical connection to at least one electrical contact. That is to say that in addition to serving for encapsulating the nanofoil is also used for contacting the electrical connection.

According to a further advantageous embodiment a single exothermic reaction of the nanofoil is activated for the purpose of simultaneously sealing the output and contacting the electrical connection to at least one electrical contact. In other words, the sealing of the output and the contacting of the electrical connection are provided through the activation of a single common exothermic reaction of the nanofoil. This results in the advantage that the electrical feedthrough can be provided with a hermetic seal and at the same time an electrical contacting of the electronic components or chips can be realized. As a result of this configuration the sealing or encapsulation of the electrical feedthrough and/or the contacting of the components or chips can be accomplished in a single process, which is to say that, for example, wire bonding can be dispensed with.

According to another advantageous embodiment an exothermic reaction of the nanofoil is activated by a laser beam. Owing to the locally limited heating there is a reduction in thermally induced stresses. The activation of the exothermic reaction is therefore induced by laser.

According to a further advantageous embodiment the laser is a carbon dioxide and/or diode laser. A reactive nanofoil with selective, exothermically triggerable reaction by laser is used for manufacturing hermetically sealed electrical feedthroughs.

According to another advantageous embodiment the nanofoil is fixed on the substrate by an adhesive.

According to a further advantageous embodiment the electronic component is contacted on the nanofoil by a conductive adhesive.

According to another advantageous embodiment the encapsulation is produced using glass and/or ceramic.

According to a further advantageous embodiment at least one electrical interlayer connection is produced through the substrate from the nanofoil to at least one metallization on the side of the substrate facing away from the nanofoil.

According to another advantageous embodiment the interlayer connection is produced using multilayer high-temperature cofired ceramics (HTCCs).

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
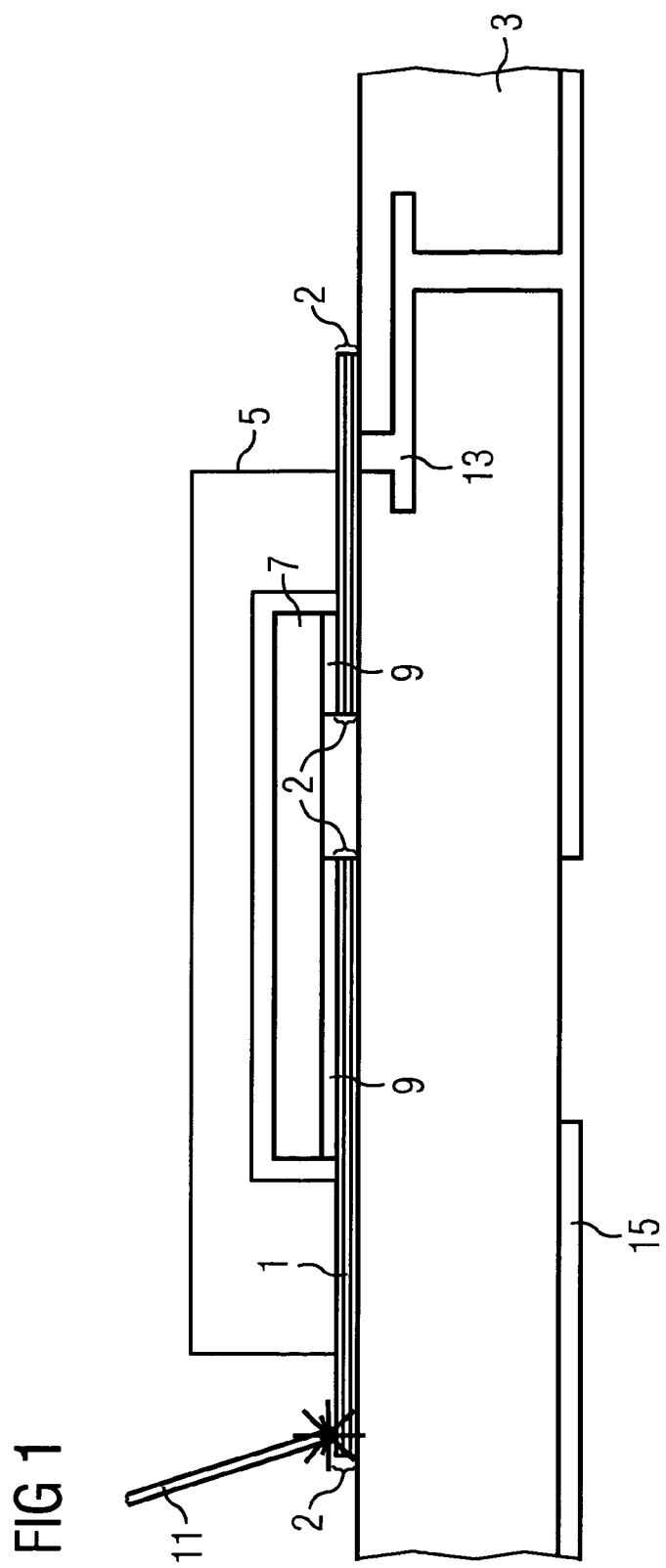
FIG. 1 shows an exemplary embodiment of a device produced according to the invention with hermetically sealed electrical feedthroughs by exothermic nanofoil in a schematic representation.

Reference will now be made in detail to the preferred embodiments of the present invention, examples of which are illustrated in the accompanying drawings, wherein like reference numerals refer to like elements throughout.

FIG. 1 shows an exemplary embodiment of a device produced according to the invention. Reference numeral 1 designates an electrical connection which can also be referred to as an interlayer connection. This is provided by a reactive nanofoil 2 that contains aluminum and nickel, for example. The nanofoil 2 is coated on both sides with a solder layer that contains AgSn, for example. Reference numeral 3 designates a substrate. Reference numeral 5 designates an encapsulation or package cover that has ceramic and/or glass, for example. An electronic component 7 is fixed inside the encapsulation 5. The coated nanofoil 2 is mounted on the substrate 3 in patterned form. The electronic component 7 is contacted on the patterned nanofoil 2. Contactings of this kind are designated by reference numeral 9. Reference numeral 11 designates a laser beam for initiating an exothermic reaction of the reactive nanofoil 2. FIG. 1 also shows an electrical interlayer connection 13 through the substrate 3 from the nanofoil to at least one metallization 15 on the side of the substrate 3 facing away from the nanofoil 2.

Figure 2:
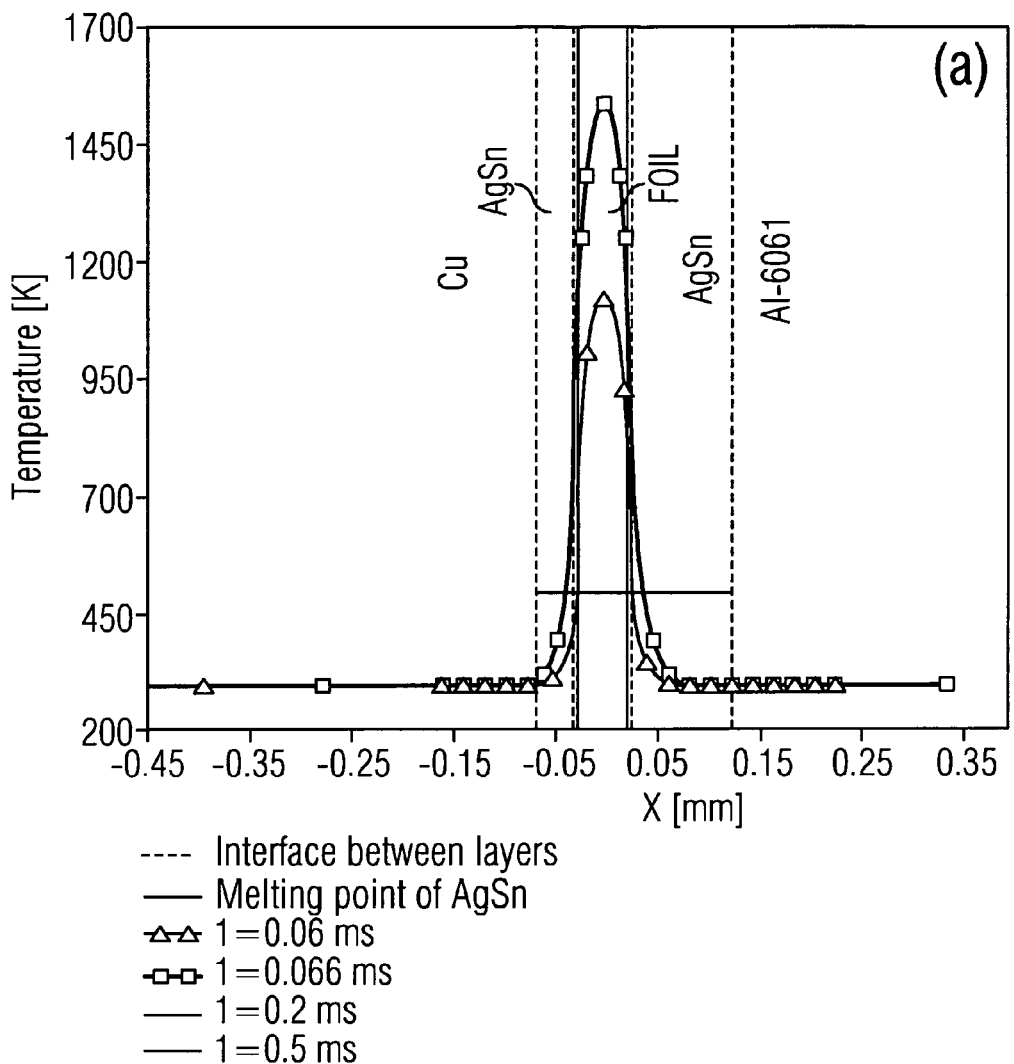
FIG. 2 shows a representation of the temperature profile in the joint zone.

FIG. 2 shows a temperature profile in the joint zone. A temperature profile of the kind in the joint zone can be computed using numeric models and is adjusted by way of the dimensioning of the nanofoil 2 and the solder layer thickness. FIG. 2 shows the computation of the transient temperature profile based on the example of a copper/aluminum combination. FIG. 2 is taken from Van Heerden et al., FIG. 5a. A very rapid temperature rise/decay lasting less than 1 millisecond occurs upon appropriately locally limited heating of the joint zone.

Figure 3:
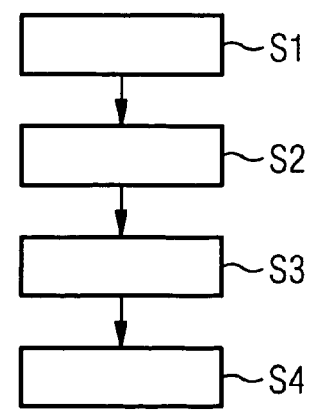
FIG. 3 shows the steps in an exemplary embodiment of a method according to the invention.

FIG. 3 shows the steps in an exemplary embodiment of a method according to the invention for producing at least one hermetically sealed electrical connection 1 from at least one electronic component 7 positioned inside an encapsulation 5 on a substrate 3 to outside of the encapsulation 5. According to a step S1, at least one patterned reactive nanofoil 2 coated on both sides with a solder layer is fixed on the substrate 3. At a step S2, the electronic component 7 is contacted on the side of the nanofoil 2 facing away from the substrate 3. At a step S3, the encapsulation 5 of the electronic component 7 is produced on the substrate 3 and/or on the nanofoil 2. At a step S4, an exothermic reaction of the nanofoil 2 is activated outside of the encapsulation 5 for the purpose of sealing the output of the electrical connection 1.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV*, 69 USPQ2d 1865 (Fed. Cir. 2004).

The invention claimed is:

1. A method for producing an electrical connection, comprising:
   fixing, on a substrate, a patterned reactive nanofoil coated on both sides with a solder layer, one side of the nanofoil facing away from the substrate;
   placing an electronic component on the substrate and contacting the electrical component to the nanofoil on the side of the nanofoil facing away from the substrate so that the patterned reactive nanofoil produces the electrical connection from the electronic component;
   producing encapsulation around the electronic component and a portion of the nanofoil; and
   activating an exothermic reaction in the nanofoil from outside of the encapsulation to hermetically seal an output of the electrical connection from the encapsulation.

2. The method as claimed in claim 1, wherein
   activating the exothermic reaction in the nanofoil from outside of the encapsulation causes the nanofoil to electrically contact the electronic component to thereby form the electrical connection.

3. The method as claimed in claim 2, wherein
   a single exothermic reaction in the nanofoil simultaneously seals the output of the electrical connection and creates electrical contact from the electrical connection to the electronic component.

4. The method as claimed in claim 3, wherein
   the exothermic reaction of the nanofoil is activated with a laser beam.

5. The method as claimed in claim 4, wherein
   the laser beam is generated by a carbon dioxide and/or diode laser.

6. The method as claimed in claim 5, wherein
   an adhesive is used for fixing the nanofoil on the substrate.

7. The method as claimed in claim 6, wherein
   a conductive adhesive is used for contacting of the electronic component to the nanofoil.

8. The method as claimed in claim 7, wherein
   the encapsulation is produced using glass and/or ceramic.

9. The method as claimed in claim 8, further comprising producing an electrical interlayer connection through the substrate from the nanofoil to a metallization formed on a side of the substrate facing away from the nanofoil.

10. The method as claimed in claim 9, wherein
    the interlayer connection is produced using multilayer high-temperature co-fired ceramics (HTCCs).

11. The method as claimed in claim 1, wherein
    a single exothermic reaction in the nanofoil simultaneously seals the output of the electrical connection and creates electrical contact from the electrical connection to the electronic component.

12. The method as claimed in claim 1, wherein
    the exothermic reaction of the nanofoil is activated with a laser beam.

13. The method as claimed in claim 12, wherein the laser beam is generated by a carbon dioxide and/or diode laser.

14. The method as claimed in claim 1, wherein
    an adhesive is used for fixing the nanofoil on the substrate.

15. The method as claimed in claim 1, wherein
    a conductive adhesive is used for contacting of the electronic component to the nanofoil.

16. The method as claimed in claim 1, wherein
    the encapsulation is produced using glass and/or ceramic.

17. The method as claimed in claim 1, further comprising producing an electrical interlayer connection through the substrate from the nanofoil to a metallization formed on a side of the substrate facing away from the nanofoil.

18. The method as claimed in claim 17, wherein
    the interlayer connection is produced using multilayer high-temperature co-fired ceramics (HTCCs).

19. A device comprising:
    a substrate;
    a patterned reactive nanofoil fixed on the substrate, the patterned reactive nanofoil being coated on both sides with a solder layer, one side of the nanofoil facing away from the substrate;
    an electronic component placed on the substrate and in contact with the side of the nanofoil facing away from the substrate so that the patterned reactive nanofoil produces an electrical connection from the electronic component; and
    encapsulation provided around the electronic component and a portion of the nanofoil such that the electrical connection extends from the encapsulation at an output, wherein
    the encapsulation is hermetically sealed to the output of the electrical connection by activating an exothermic reaction in the nanofoil from outside of the encapsulation.

* * * * *